(12) United States Patent
Kadota et al.

(10) Patent No.: US 6,437,363 B1
(45) Date of Patent: Aug. 20, 2002

(54) SEMICONDUCTOR PHOTONIC DEVICE

(75) Inventors: Michio Kadota, Kyoto; Takashi Fujii, Otsu, both of (JP)

(73) Assignee: Murata Manufacturing Co. Ltd. (JP)

( * ) Notice: Subject to any disclaimer, the term of this patent is extended or adjusted under 35 U.S.C. 154(b) by 0 days.

(21) Appl. No.: 09/390,558

(22) Filed: Sep. 3, 1999

(30) Foreign Application Priority Data

Sep. 25, 1998 (JP) .............................. 10-272027

(51) Int. Cl.$^7$ ................................ H01L 29/12
(52) U.S. Cl. ................... 257/43; 257/14; 257/15; 257/18; 257/22; 257/94; 257/96; 257/98; 257/103; 257/45; 257/46
(58) Field of Search ................... 257/190, 200, 257/103, 43

(56) References Cited

U.S. PATENT DOCUMENTS

| | | | |
|---|---|---|---|
| 5,237,182 A | 8/1993 | Kitagawa et al. | 257/15 |
| 5,587,014 A | 12/1996 | Iyechika et al. | 117/90 |
| 5,604,763 A | 2/1997 | Kato et al. | 372/45 |
| 5,670,798 A | 9/1997 | Schetzina | 257/96 |
| 5,727,008 A | 3/1998 | Koga | |
| 5,742,628 A * | 4/1998 | Fujii | 372/45 |
| 5,777,350 A * | 7/1998 | Nakamura et al. | 257/96 |
| 5,780,873 A * | 7/1998 | Itaya et al. | 257/521 |
| 5,815,520 A * | 9/1998 | Furushima | 372/45 |
| 5,889,295 A | 3/1999 | Rennie et al. | 257/96 |
| 6,031,252 A * | 2/2000 | Miura et al. | 257/96 |

FOREIGN PATENT DOCUMENTS

| | | |
|---|---|---|
| DE | 19629720 A1 | 2/1997 |
| DE | 19648955 A1 | 5/1997 |
| JP | 5710280 | 1/1982 |
| JP | 7263809 | 10/1995 |
| JP | 7-283436 | 10/1995 |
| JP | 9214051 | 8/1997 |
| JP | 9-260290 | 10/1997 |
| JP | 9275243 | 10/1997 |
| JP | 9-326534 | 12/1997 |

* cited by examiner

Primary Examiner—Douglas A. Wille
Assistant Examiner—Wai-Sing Louie
(74) Attorney, Agent, or Firm—Dickstein, Shapiro, Morin & Oshinsky, LLP.

(57) ABSTRACT

A semiconductor photonic device includes a substrate having a cleavage plane perpendicular to a principal plane thereof; a ZnO film on the substrate; and a compound semiconductor layer expressed by $In_xGa_yAl_zN$ ($x+y+z=1$, $0 \leq x \leq 1$, $0 \leq y \leq 1$, $0 \leq z \leq 1$).

12 Claims, 2 Drawing Sheets

SEMICONDUCTOR PHOTONIC DEVICE

BACKGROUND OF THE INVENTION

1. Field of the Invention

The present invention relates to a semiconductor photonic device comprising $In_xGa_yAl_zN$ (group III nitride semiconductor crystal).

2. Description of the Related Art

Recently, great attention has been attracted to GaN-based thin films and ZnSe-based thin films as light emitting device materials which emit blue light as UV rays. However, the ZnSe thin films have the fatal defect that the life time is short when they are used as a light emitting device.

The $In_xGA_yAl_2N$ thin film is regarded as a prospective material with respect to the life time, but there is a problem in that it is difficult to grow a single crystal of $In_xGa_yAl_2N$ having a large diameter.

In order to solve this problem, there has been proposed a so-called heteroepitaxial growth method by which a single crystal is grown on a substrate made of a material different from the single crystal is employed. In general, the single crystal is grown on a C-plane sapphire substrate.

However, the C-plane sapphire substrate has no cleavage plane perpendicular to the principal plane of the substrate. Accordingly, when an $In_xGa_yAl_2N$ thin film is formed on the C-plane sapphire substrate, it is impossible to form a pair of resonant facets in the $In_xGa_yAl_2N$ thin film on the C-plane sapphire substrate by a cleavage method which is often used for forming a GaAs-based semiconductor laser chip. This means that it is necessary to form the resonant facets in the $In_xGa_yAl_2N$ thin film on the C-plane sapphire substrate by chemical etching, dry-etching, polishing or the like, which generally have a low production efficiency.

In addition, the C-plane sapphire substrate has a great hardness. This property causes a problem in that the semiconductor photonic devices formed by using the C-plane sapphire substrate are difficult to cut into respective chips of the semiconductor photonic devices. For example, it takes a considerably great time to dice the C-plane sapphire substrate on which large number of semiconductor photonic devices are formed.

SUMMARY OF THE INVENTION

The present invention can solve the aforementioned problems and provide a semiconductor photonic device comprising a substrate which is easy to cleave, thereby enabling formation of resonant cavity in a simple way and achieve chip separation easily.

The semiconductor photonic device according to the present invention includes a ZnO film formed above a substrate having a cleavage plane perpendicular to the substrate principal plane and good cleavage properties, and a semiconductor compound layer expressed by $In_xGa_yAl_2N$ ($x+y+z=1$, $0 \leq x \leq 1$, $0 \leq y \leq 1$, $0 \leq z \leq 1$).

In the semiconductor photonic device of the present invention, the semiconductor layer is formed on the substrate having good cleavage properties. Accordingly, the substrate can be simply cleaved with a mechanical means such as scribing or the like, without using chemical etching, and thereby a resonant face can be formed by the cleavage and chip separation can also be performed by the cleavage.

As the substrate having good cleavage properties, for example, a A-plane sapphire substrate, a (111), (100), or (110) crystal orientation M-plane sapphire substrate having a ZnS structure, a GaP substrate, a GaAs substrate and an InP substrate may be employed. These substrates are inexpensive, and therefore the substrate cost is low. Accordingly, an inexpensive light emitting device can be produced. The GaP, GaAs, and InP substrates have a low resistance, and thereby, an electrode can be formed on the back side of an optical element.

The lattice constant in the a-axial direction of the ZnO film is nearly equal to that in the a-axial direction of the $In_xGa_yAl_2N$. Accordingly, when the above substrates are used, a c-axially oriented ZnO film is formed, and through the ZnO film, a semiconductor compound layer made of $In_xGa_yAl_2N$ with good crystallinity can be grown on an optional substrate.

Further, by forming a metal film on the substrate, and forming the ZnO film on the metal film, a desirably c-axially oriented ZnO film can be obtained, and the semiconductor compound layer made of $In_xGa_yAl_2N$ with good crystallinity can be grown thereon. Further, by forming a metal film on the substrate, the metal film can be used as a lower electrode. Thus, the electrode structure of the semiconductor photonic device can be simplified.

For the purpose of illustrating the invention, there is shown in the drawings several forms which are presently preferred, it being understood, however, that the invention is not limited to the precise arrangements and instrumentalities shown.

DETAILED DESCRIPTION OF PREFERRED EMBODIMENTS

Hereinafter, the preferred embodiments of the present invention are explained in detail with reference to the drawings.

First Embodiment

Figure 1:
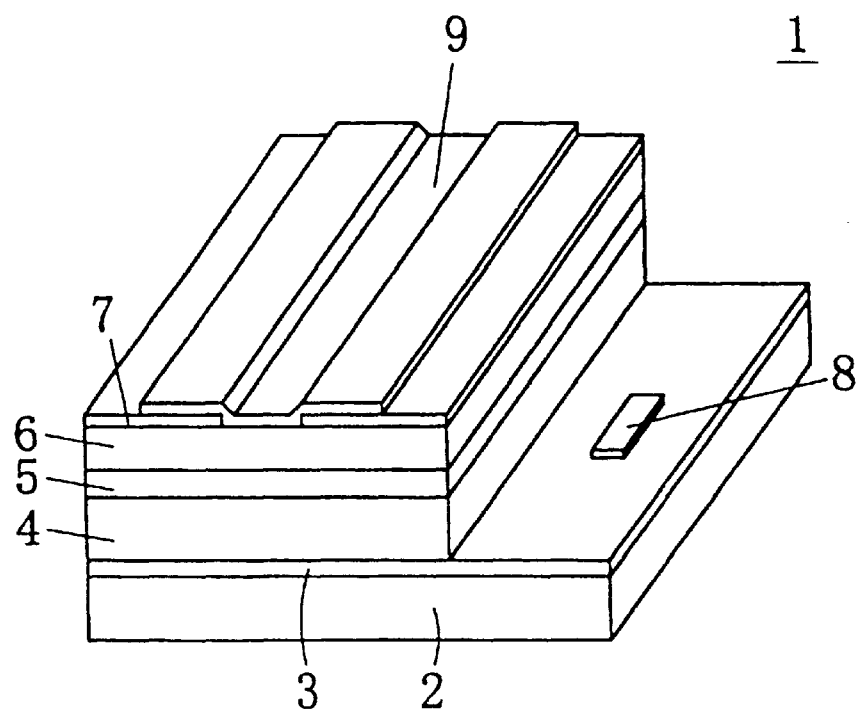
FIG. 1 is a perspective view of a semiconductor photonic device according to a first embodiment of the present invention.

FIG. 1 is a perspective view of an semiconductor photonic device 1 such as an edge-emitting type semiconductor laser diode, an edge-emitting type light emitting diode or the like, according to an embodiment of the present invention. This semiconductor photonic device 1 is prepared as follows. First, after an A-plane sapphire substrate 2 is chemically etched or dry-etched, a ZnO film 3 having a low resistance is formed on the A-plane sapphire substrate 2. It may be difficult to c-orient the ZnO film 3 in a c-axis direction on the A-plane sapphire substrate 2, but the chemical etching or dry etching of the surface of the A-plane sapphire substrate 2 enables the successful formation of the ZnO film 3 on the A-plane sapphire substrate 2. An $SiO_2$ film 7 is epitaxially grown on the upper face of a p-type GaN cladding layer 6. Subsequently, the central portion of the $SiO_2$ film 7 is provided with an aperture by etching. Further, an n-type GaN cladding layer 4, a p-type $In_xGa_yN$ ($x+y=1$) activating layer 5, the p-type GaN cladding layer 6 and the SiO$_2$ film 7 are partially removed by etching, so that a part of the ZnO film 3 is exposed. Then, the A-plane sapphire substrate 2 having the ZnO film 3, a light emitting mechanism, and so forth, formed thereon is scribed so that a resonant face of the light emitting device 1 is formed. Subsequently, an lower electrode 8 is formed on the exposed portion of the ZnO film 3 and the upper surface of the p-type GaN cladding layer 6 is covered with an upper electrode 9 through the SiO$_2$ film 7.

The lattice constant in the a-axial direction of ZnO is nearly equal to that in the a-axial direction of GaN. Therefore, by forming the ZnO film 3 oriented in the c-axis direction on the substrate 2, and forming the n-type GaN cladding layer 4 and so forth thereon, a n-type GaN cladding layer 4 and so forth having a good crystallinity can be obtained. It has been conventionally thought that it is very difficult to orient the ZnO film 3 on the A-plane sapphire substrate 2 in the c-axis direction. However, when the surface of the A-plane sapphire substrate 2 is chemically etched or dry-etched and then the ZnO film 3 is formed, as in the present invention, a c-axially oriented ZnO film 3 can be obtained.

The ZnO film, the GaN layer, and so forth, belong to a hexagonal system. When they are grown on the (0001) plane, both of the ZnO film and the GaN layer have cleavage planes on the (1-100) plane (i.e., the M plane) and on the (11-20) plane (i.e., the A plane). Accordingly, when the ZnO film is epitaxially grown the (0001) plane, the cleavage planes become coincident with each other. If the cleavage direction of the substrate and that of the ZnO film and the GaN layer are controlled to be perpendicular to the growing plane, a cavity can easily be formed during production by a laser. On the other hand, the cleavage plane of sapphire is the (01-12) plane. This is the R plane. It is only in the A-plane sapphire substrate that the R-plane of sapphire is perpendicular to the principal plane of the substrate.

Accordingly, by use of an A-plane sapphire substrate 2, the cleavage plane of the substrate can be made perpendicular to the principal plane of the substrate, and the cleavage directions of the c-axially oriented ZnO film 3, the n-type GaN cladding layer 4, and so forth, grown thereon become perpendicular to the principal plane of the substrate. Thus, the A-plane sapphire substrate 2 can be cleaved by a mechanical method such as scribing and so forth, without using chemical etching. The resonant facets can be easily obtained.

In the semiconductor photonic device 1, the resistance of the ZnO film 3 can be made low. Therefore, even if an insulation substrate 2 is used, a current can flow between the lower electrode 8 and the upper electrode 9 through the ZnO film 3, and thereby, the semiconductor photonic device 1 emits light, and UV light rays in blue color are emitted. Thus, even if an insulation substrate 2 is used, the structure of the lower electrode 8 can be simplified.

To impart the ZnO film 3 with a low resistance, it may be doped with a group III or V impurity element. For example, as group III elements, B, Al, Ga, In, Tl, Sc, Y, La, Ac or the like may be used. As group V elements, P, As, Sb, Bi, V, Nb, Ta or the like may be used. As to a method of doping, for example, the impurity may be doped into a target which is provided to form a ZnO film 3.

Second Embodiment

Figure 2:
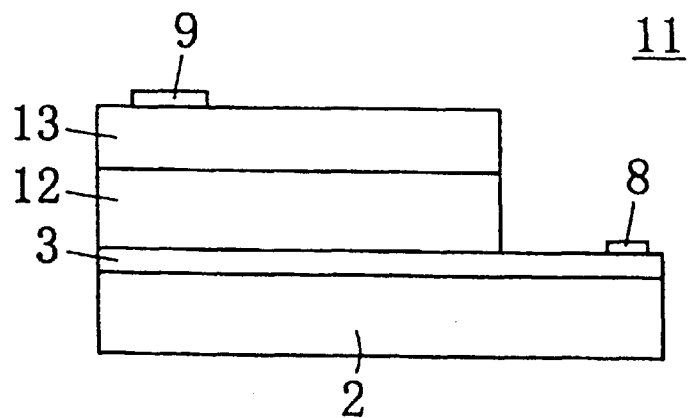
FIG. 2 is a cross-sectional view of a semiconductor photonic device according to a second embodiment of the present invention.

FIG. 2 is a cross-sectional view of a planar light emitting type light emitting device 11 as a semiconductor photonic device according to a further embodiment of the present invention. In this embodiment, on the A-plane sapphire substrate 2, the c-axially oriented ZnO film 3 with a low resistance is formed. On the ZnO film 3, a p-type GaN layer 12 and a n-type GaN layer 13 are formed. Then, the ZnO layer is partially exposed by removing a portion of the p-type GaN layer 12 and the n-type GaN layer 13. An upper electrode 9 is provided on the n-type GaN layer 13, while a lower electrode 8 is formed on the ZnO film 3.

In this way, a plurality of the light emitting devices 11 are formed on the A-plane sapphire substrate 2, and the light emitting devices 11 are then isolated into respective chips by scribing the A-plane sapphire substrate 2 along prescribed chip patterns and cleaving the A-plane sapphire substrate 2 along the scribing lines.

As explained in detail in the first embodiment, the A-plane sapphire substrate 2 is easily cleaved in the direction perpendicular to the main surface of the A-plane sapphire substrate 2. Therefore, it is very easy to separate a plurality of the light emitting devices 11 into respective chips. It has been found that the process time for separation of chips by the cleavage method is one-tenth that of a dicing method.

The light emitting device 11 is of a planar light emitting type. When a voltage is applied between the upper electrode 9 and the lower electrode 8, light generated between the n-type GaN layer 13 and the p-type GaN layer 12 exits outward from the n-type GaN layer 13.

It is to be noted that the A-plane sapphire substrate 2 is transparent. Therefore, in this embodiment, if the opposite sides of the A-plane sapphire substrate 2 are polished to a mirror finish, light generated between the n-type GaN layer 13 and the p-type GaN layer 12 can be made to exit outward from the front and back sides (that is, on the substrate 2 side, and on the n-type GaN layer 13 side).

Third Embodiment

Figure 3:
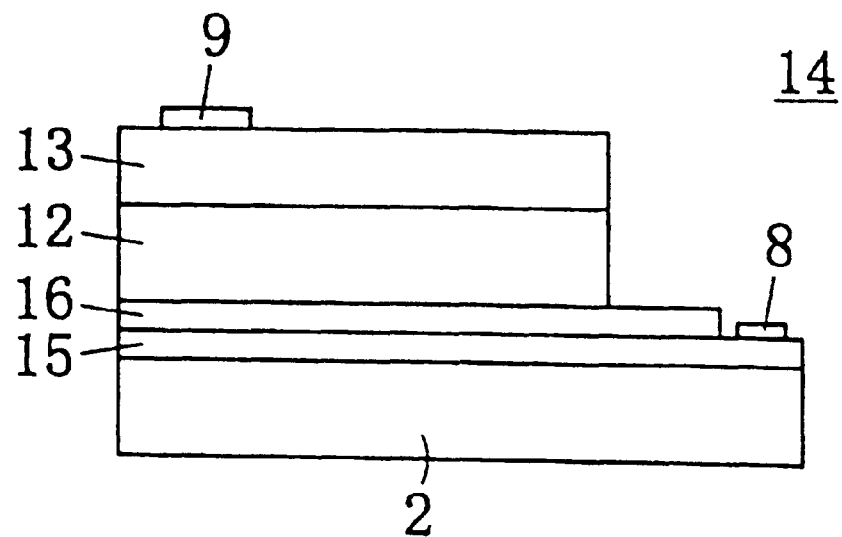
FIG. 3 is a cross-sectional view of a semiconductor photonic device according to a third embodiment of the present invention.

FIG. 3 is a cross-sectional view of a planar light emitting type light emitting device 14 as a semiconductor photonic device according to a still further embodiment of the present invention. In this embodiment, a metal film 15 is formed on the A-plane sapphire substrate 2 and a ZnO film 16 is formed on the metal film 15 so as to be oriented in the c-axis direction. On the ZnO film 16, the p-type GaN layer 12 and the n-type GaN layer 13 are formed. Subsequently, the layers above the ZnO film 16 are etched so that the metal film 15 is partially exposed. An upper electrode 9 is provided on the n-type GaN layer 13, while a lower electrode 8 is formed on the metal film 15.

In this way, a plurality of the light emitting devices 14 are formed on the A-plane sapphire substrate 2, and the light emitting devices 14 are then cut into respective chips by scribing the A-plane sapphire substrate 2 along prescribed chip patterns and cleaving the A-plane sapphire substrate 2 along the scribing lines.

When the metal film 15 is formed on the substrate 2 as in this light emitting device 14 and the ZnO film 16 is formed thereon, the ZnO film 16 can be easily c-axially oriented. Further, since a lower electrode 8 can be provided on the metal film 15, it is unnecessary to treat the ZnO film 16 so that it has a low resistance.

Also in this embodiment, when the electrode films are formed with transparent ITO films, and the opposite sides of the A-plane sapphire substrate 2 are polished to a mirror finish, light generated between the n-type GaN layer 13 and the p-type GaN layer 12 can be made to exit outward from the front and back sides.

Fourth Embodiment

Figure 4:
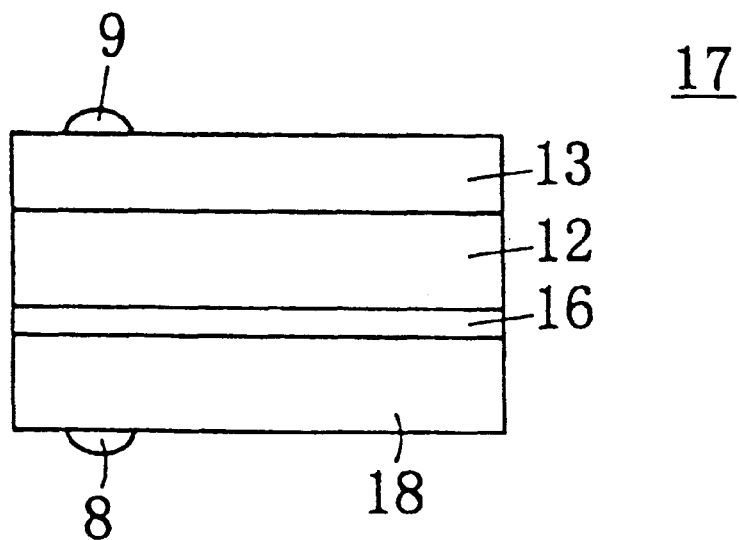
FIG. 4 is a cross-sectional view of a semiconductor photonic device according to fourth embodiment of the present invention.

FIG. 4 is a side view of a planar light emitting type light emitting device 17 according to another embodiment of the present invention. In the light emitting device 17, on a substrate 18 having a cleavage plane perpendicular to the substrate principal plane, such as a (100) crystal orientation GaP substrate having a ZnS structure, a (111) crystal orientation GaP substrate, a (110) crystal orientation GaP substrate, a (100) crystal orientation GaAs substrate, a (111) crystal orientation GaAs substrate, a (110) crystal orientation GaAs substrate, a (100) crystal orientation InP substrate, a (111) crystal orientation InP substrate, a (110) crystal orientation InP substrate, and so forth, a c-axially oriented ZnO film 16 is made to grow. The p-type GaN layer 12 and the n-type GaN layer 13 are formed thereon.

After electrodes 8 and 9 are formed on the substrate 18 and the n-type GaN layer 13, respectively, the substrate 18 is cleaved so as to separate the respective chips of the light emitting device 17.

In the light emitting device 17, when a voltage is applied between the upper electrode 9 formed on the upper surface of the n-type GaN layer 13 and the lower electrode 8 formed on the lower surface of the substrate 18, a current is injected into the light emitting device 17, and light is emitted at the interface between the p-type GaN layer 12 and the n-type GaN layer 13.

As seen in the above description, when a substrate 18 made of GaAs, GaP, InP or the like is used, the ZnO film 16 can be easily oriented in the c-axis direction. In addition, since these substrates 18 have cleavage properties, it is possible to form a laser cavity for the light emitting device 17 by cleaving the substrate 18 with a mechanical means such as scribing, and it is not necessary to use chemical etching. At the same time, a plurality of the light emitting devices 17 formed on the substrate 18 can be divided into a respective chips.

Moreover, since substrate 18 is electroconductive, the lower electrode 8 can be provided on the lower surface of the substrate 18. Therefore, in the above-described embodiment, it is unnecessary to reduce the resistance of the ZnO film 16 or form a metal electrode film below the ZnO film 16. Thus, the structure of the semiconductor photonic device 17 can be simplified.

The edge-emitting type light emitting device 17 may be produced by use of the substrate 18 having a cleavage plane such as GaAs, GaP, InP or the like, although they are not shown in the figure.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A semiconductor photonic device comprising:
   a substrate having a cleavage plane perpendicular to a principal plane thereof and being selected from the group consisting of GaP, GaAs and InP substrates having a (100), (111) or (110) crystal orientation;
   a ZnO film on a principal plane of the substrate; and
   a semiconductor compound layer expressed by $In_xGa_yAl_zN$ wherein $x+y+z=1$, $0 \leq x \leq 1$, $0 \leq y \leq 1$, $0 \leq z \leq 1$ in communication with the ZnO film.

2. A semiconductor photonic device according to claim 1, wherein the ZnO film is oriented in the c-axis direction with respect to the principal plane of the substrate.

3. A semiconductor photonic device according to claim 2, further comprising a metal film between the semiconductor compound layer and the ZnO.

4. A semiconductor photonic device according to claim 3 having a p-GaN layer on the ZnO, a n-GaN layer on the p-GaN layer, and electrodes on the substrate and n-GaN layer.

5. A semiconductor photonic device according to claim 2, wherein the substrate is an A-plane sapphire substrate.

6. A semiconductor photonic device according to claim 2, wherein the substrate is a GaP substrate having a (100), (111) or (110) crystal orientation.

7. A semiconductor photonic device according to claim 2, wherein the substrate is a GaAs substrate having a (100), (111) or (110) crystal orientation.

8. A semiconductor photonic device according to claim 2, wherein the substrate is InP substrate having a (100), (111) or (110) crystal orientation.

9. A semiconductor photonic device according to claim 2 having a n-GaN layer on the ZnO, a p-$In_xGa_yN$ layer on the GaN layer, a p-GaN layer on the $In_xGa_yN$ layer, a $SiO_2$ layer on the p-GaN layer, and electrodes on the substrate and $SiO_2$ layer.

10. A semiconductor photonic device according to claim 2 having a p-GaN layer on the ZnO, a n-GaN layer on the p-GaN layer, and electrodes on the substrate and n-GaN layer.

11. A semiconductor photonic device according to claim 10, wherein the ZnO is a doped ZnO.

12. A semiconductor photonic device according to claim 1, wherein the ZnO film is a doped ZnO film.

* * * * *